(12) United States Patent
Hooper et al.

(10) Patent No.: US 8,906,747 B2
(45) Date of Patent: Dec. 9, 2014

(54) CAVITY-TYPE SEMICONDUCTOR PACKAGE AND METHOD OF PACKAGING SAME

(75) Inventors: Stephen R. Hooper, Mesa, AZ (US); Philip H. Bowles, Fountain Hills, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 120 days.

(21) Appl. No.: 13/478,557

(22) Filed: May 23, 2012

(65) Prior Publication Data

US 2013/0313700 A1   Nov. 28, 2013

(51) Int. Cl.
*H01L 23/02*   (2006.01)
*H01L 21/762*   (2006.01)

(52) U.S. Cl.
USPC ........... 438/119; 438/118; 438/106; 257/704; 257/678

(58) Field of Classification Search
CPC ....................................................... H01I 23/02
USPC ................... 257/678, 704; 438/106, 118, 119
See application file for complete search history.

(56) References Cited

U.S. PATENT DOCUMENTS

| 6,300,673 | B1 | 10/2001 | Hoffman et al. | |
| 6,867,367 | B2 | 3/2005 | Zimmerman | |
| 7,534,716 | B2 | 5/2009 | Chiu et al. | |
| 7,732,914 | B1 | 6/2010 | McLellan et al. | |
| 2003/0113724 | A1* | 6/2003 | Schembri et al. | 435/6 |
| 2007/0037058 | A1* | 2/2007 | Visco et al. | 429/246 |
| 2010/0109152 | A1* | 5/2010 | Kariyazaki | 257/704 |

* cited by examiner

*Primary Examiner* — Colleen A Matthews
*Assistant Examiner* — William Harriston
(74) *Attorney, Agent, or Firm* — Charlene R. Jacobsen

(57) ABSTRACT

A method (30) of forming a semiconductor package (20) entails applying (56) an adhesive (64) to a portion (66) of a bonding perimeter (50) of a base (22), with a section (68) of the perimeter (50) being without the adhesive (64). A lid (24) is placed on the base (22) so that a bonding perimeter (62) of the lid (24) abuts the bonding perimeter (50) of the base (22). The lid (24) includes a cavity (25) in which dies (38) mounted to the base (22) are located. A gap (70) is formed without the adhesive (64) at the section (68) between the base (22) and the lid (24). The structure vents from the gap (70) as air inside the cavity (25) expands during heat curing (72). Following heat curing (72), another adhesive (80) is dispensed in the section (68) to close the gap (70) and seal the cavity (25).

11 Claims, 5 Drawing Sheets

US 8,906,747 B2

CAVITY-TYPE SEMICONDUCTOR PACKAGE AND METHOD OF PACKAGING SAME

TECHNICAL FIELD OF THE INVENTION

The present invention relates generally to semiconductor packaging. More specifically, the present invention relates to a lid attachment technique for a cavity-type microelectromechanical systems (MEMS) device package.

BACKGROUND OF THE INVENTION

Microelectronic and microelectromechanical systems (MEMS) technology has achieved wide popularity in recent years, as it provides a way to make very small electronic and mechanical structures and integrate these structures on a single substrate using conventional batch semiconductor processing techniques. While such microelectronic and MEMS devices are becoming mainstream technologies, cost effectively packaging them in semiconductor packages for manufacture and ease of use remains challenging.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 1:
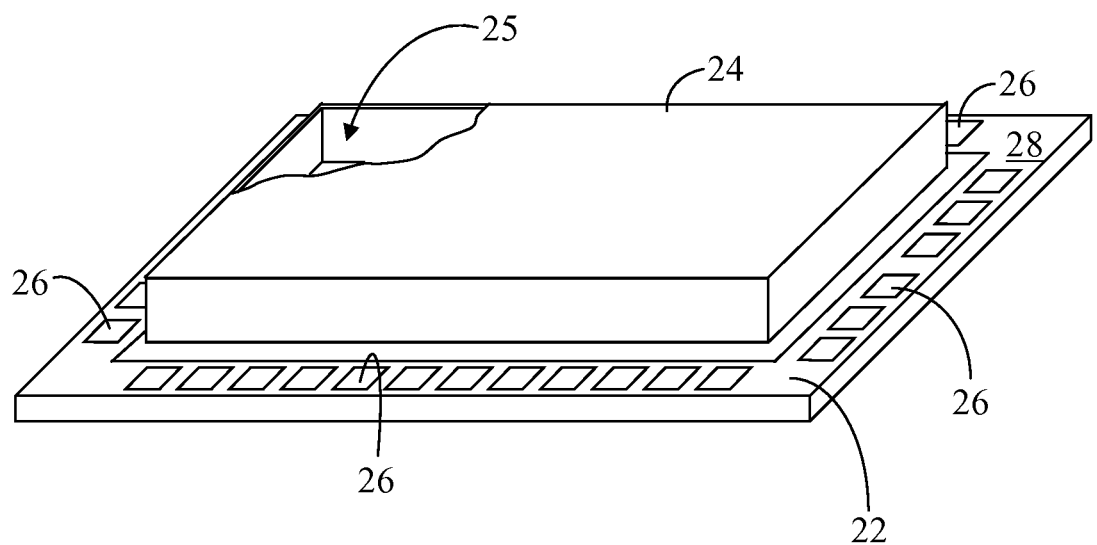
FIG. 1 shows a perspective view of an exemplary cavity-type semiconductor package in accordance with an embodiment.

Semiconductor packages generally provide a set of related elements. These elements include, for example, one or more semiconductor devices to be packaged, interconnection from the devices to the package, a surrounding or containing structure to provide both mechanical support and electrical, chemical, and environmental protection, and a joining structure to attach the package to the board or system. The challenges faced by developers of semiconductor packaging processes result from, for example, the sensitivity of the semiconductor devices (e.g., microelectronics and microstructures) to high temperature processes, the need for suitable shielding, the requirement in some instances for a hermetic or near-hermetic seal to protect the devices from contaminants, and so forth.

Indeed, protection is a key element in packaging many semiconductor devices because corrosion, moisture, and debris can prevent the devices from working. That is, if the packaging protection is compromised, the semiconductor device may fail, producing no output for a given input or producing invalid or inaccurate output for a given input. As integrated circuit (IC) device geometries continue to decrease, the use of microelectromechanical systems (MEMS) devices continues to rise, and the fabrication of semiconductor packages containing multiple semiconductor devices continue to evolve, the need for low cost, reliable, high density packaging solutions increases.

Some types of semiconductor devices call for cavity-type packaging in which one or more devices mounted to a base are housed within a cavity of a lid structure that is adhered to the base. The cavity-type lid structure functions in part to provide environmental protection for the packaged devices. Some lid attachment materials for cavity-type semiconductor packaging, call for heat curing to harden the lid attach material dispensed between the base that includes one or more semiconductor devices and the lid having a cavity in which the semiconductor devices are to reside. During heat curing, an opening, also referred to as a blow hole, may form in the bonding material due to pressure from the expanding air inside the cavity as the structure is heated from room temperature to the cure temperature. Blow holes may form in the lid attach material so that the expanded gas can escape from the cavity. These blow holes can provide ingress for foreign media such as water, soda, acids, brake fluid, salt spray, and any other contaminants that could damage the devices located within the cavity. Foreign media inside of a cavity-type semiconductor package could result in the formation of unwanted electrically conductive paths in the cavity, the breakage of wanted conductive paths, e.g., bonding wires, and/or the swelling or delamination of the materials within the cavity.

To avoid problems associated with the formation of blow holes, room temperature cure materials have been proposed. However, some room temperature cure materials may not be suitable for designs requiring electromagnetic shielding. In order to provide electromagnetic shielding, the lid is formed from a conductive material, such as metal. A conductive lid may not be effective for electromagnetic shielding unless it is attached to ground in the semiconductor package. In such a configuration, the lid attachment material should be conductive to provide a path to ground. Prior art conductive lid attachment materials adapted to cure at room temperature have short working times. A short working time, also referred to as pot life, is the length of time a material is useful after its original package is opened or a catalyst or other curing agent is added. The short pot life of a room temperature curable conductive lid attachment material is an undesirable characteristic in a production environment. Some prior art lid attachment materials adapted to cure at room temperature using, for example, ultraviolet radiation, can have a longer pot life. However, such UV curable lid attachment materials are generally unavailable in a conductive form.

Another technique that may be implemented to avoid problems with the formation of blow holes is ultrasonic welding. In ultrasonic welding, high-frequency ultrasonic acoustic vibrations are locally applied to workpieces to create a solid-state weld. In ultrasonic welding, no soldering materials, adhesives, fasteners, and the like are needed to bind the materials together. Thus, blow holes cannot form. However, ultrasonic welding can be unsuitable for use with semiconductor packages containing, for example, MEMS devices because the high-frequency ultrasonic acoustic vibrations may break the fragile moving microstructures of the MEMS devices located within the cavity.

Embodiments entail a cavity-type semiconductor packaging methodology and a semiconductor device structure packaged in accordance with the packaging methodology. The cavity-type semiconductor packaging methodology provides secure lid attachment that enables venting of the expanded gasses during heat curing, while yielding a hermetic or near-hermetic seal. The methodology is particularly suited to device packages that call for electromagnetic shielding and/or that include a MEMS device for which ultrasonic weld, heat cure, or room temperature cure processes may be unsuitable.

FIG. 1 shows a perspective view of an exemplary cavity-type semiconductor package 20 in accordance with an embodiment. In general, semiconductor package 20 includes a base 22 having a lid 24 bonded thereto. In FIG. 1, a portion of lid 24 is cut back to reveal a cavity 25 formed in lid 24 for cavity-type semiconductor package 20. Leads 26 may be formed on a surface 28 of base 22 and are exposed from lid 24. Leads 26 are conductive features that enable electrical connection between elements external to semiconductor package 20 and the components (not visible) mounted to base 22 and enclosed within cavity 25.

In an embodiment, semiconductor package 20 may include semiconductor devices such as microelectronic and/or microelectromechanical systems (MEMS) devices (e.g., gyroscope, accelerometer, sensor, or other microstructures). A cavity-type semiconductor package configuration is shown herein for exemplary purposes. However, semiconductor package 20 may take on a wide variety of forms, sizes, shapes, and functions in accordance with particular design criteria.

Figure 2:
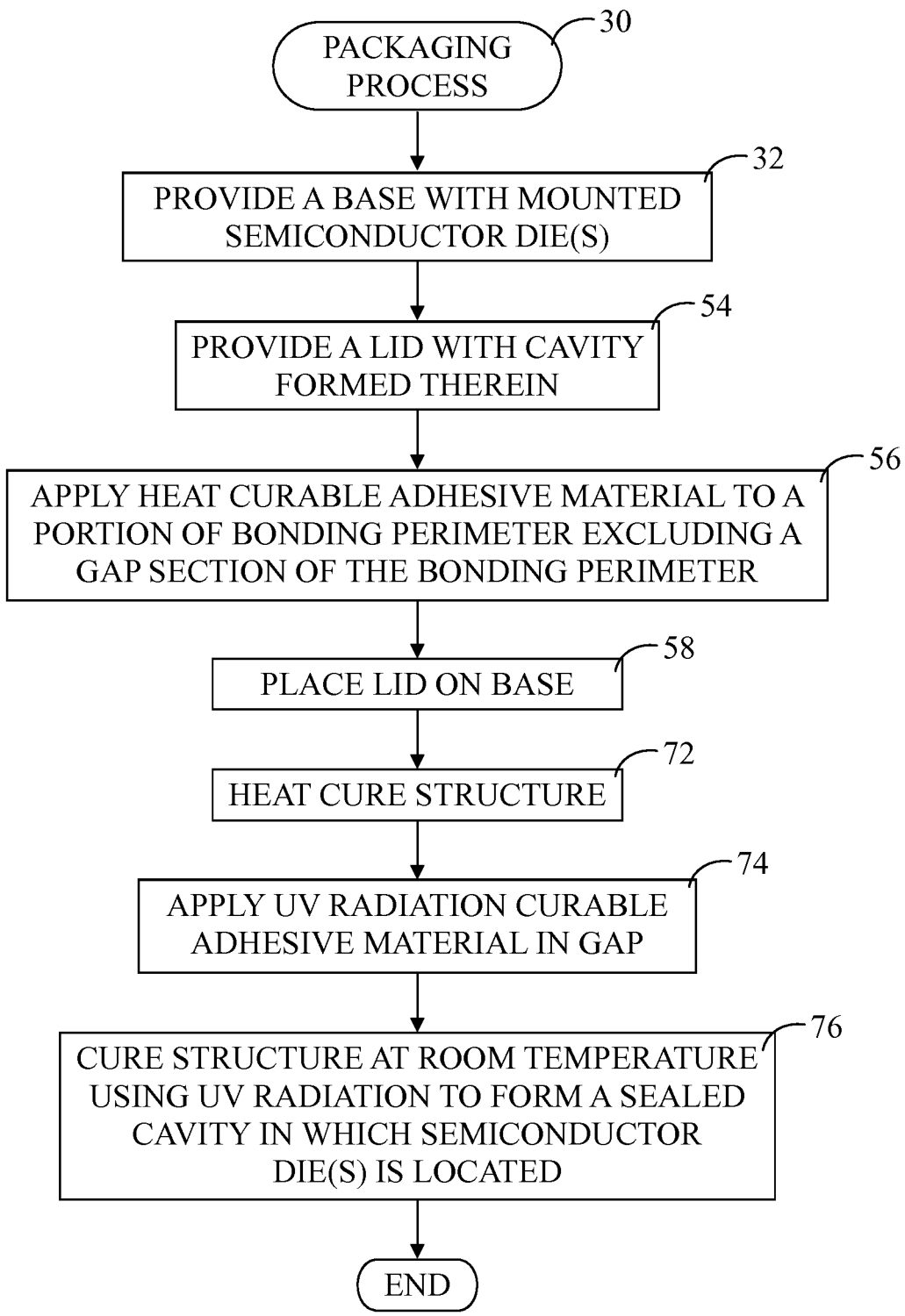
FIG. 2 shows a flowchart of a packaging process for packaging the cavity-type semiconductor package of FIG. 1 in accordance with another embodiment.

FIG. 2 shows a flowchart of a packaging process 30 for packaging semiconductor package 20 (FIG. 1) in accordance with another embodiment. Packaging process 30 sets forth a lid attach technique that enables the ability to vent pressure from a cavity within the lid as the lid is attached to a base using a heat curing lid attach material, while subsequently yielding a hermetic or near-hermetic seal to substantially limit damage to the components within semiconductor package 20 from external contaminants such as moisture, particulates, and so forth. Process 30 will be discussed in connection with the packaging of cavity-type semiconductor package 20 containing MEMS devices. However, it should become apparent that the following methodology can be adapted to packaging methodology for a multiplicity of semiconductor designs in which a cavity-type lid is to be attached to provide a hermetic or near-hermetic seal.

Packaging process 30 is described below in connection with a single semiconductor package for simplicity of illustration. However, it should be understood by those skilled in the art that the following process allows for concurrent packing of a plurality of semiconductor packages. For example, multiple semiconductor packages may undergo concurrent packaging on base 22, where base 22 may be a leadframe strip or panel. A cap wafer having multiple lids 24 formed therein can subsequently be attached to the leadframe strip or panel per the following methodology to form multiple semiconductor packages 20. The resulting structure of multiple semiconductor packages 20 can then be singulated by, for example, dicing or punching in a conventional manner to provide individual semiconductor packages 20 that may be coupled onto a printed circuit board in an end application.

Packaging process 30 begins with an activity 32. At activity 32, base 22 is provided with one or more semiconductor dies mounted thereon.

Figure 3:
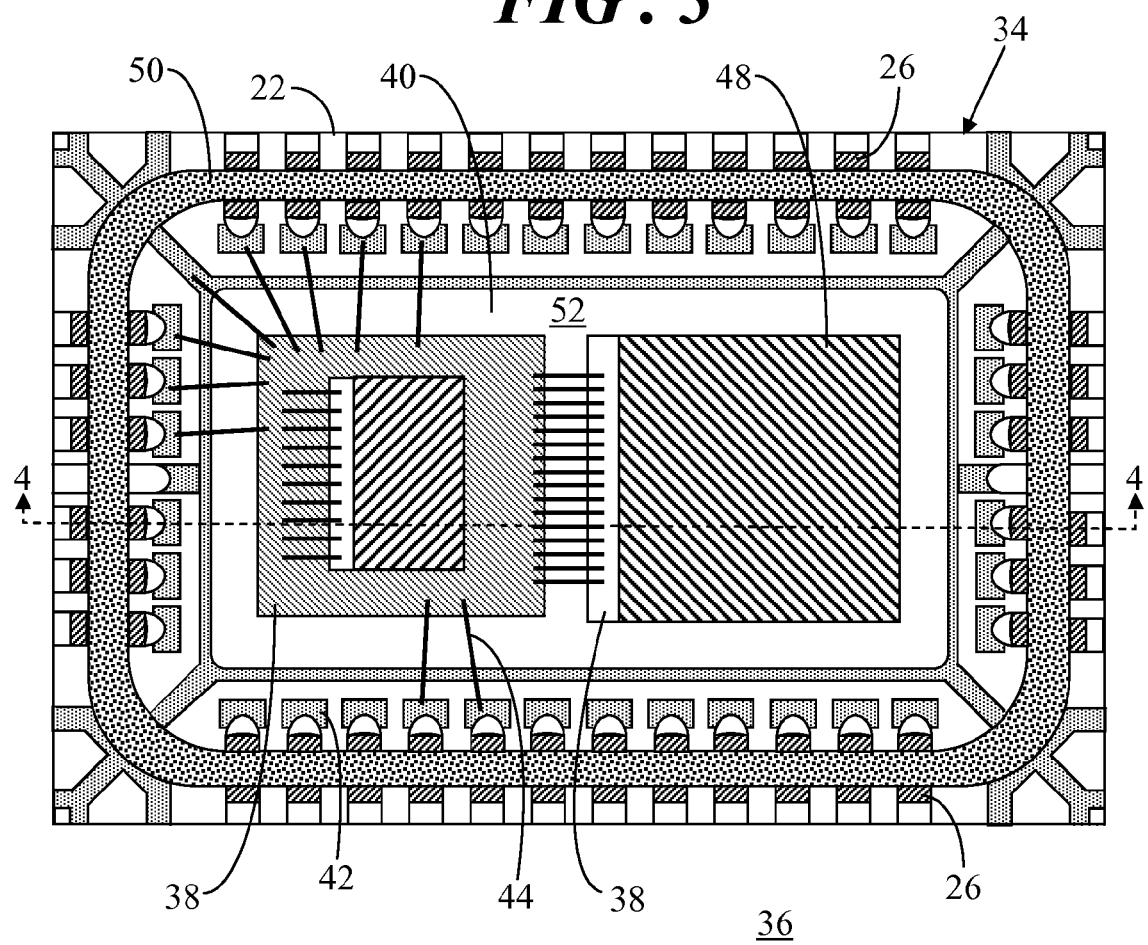
FIG. 3 shows a top view of a device at an initial stage of packaging.
Figure 4:
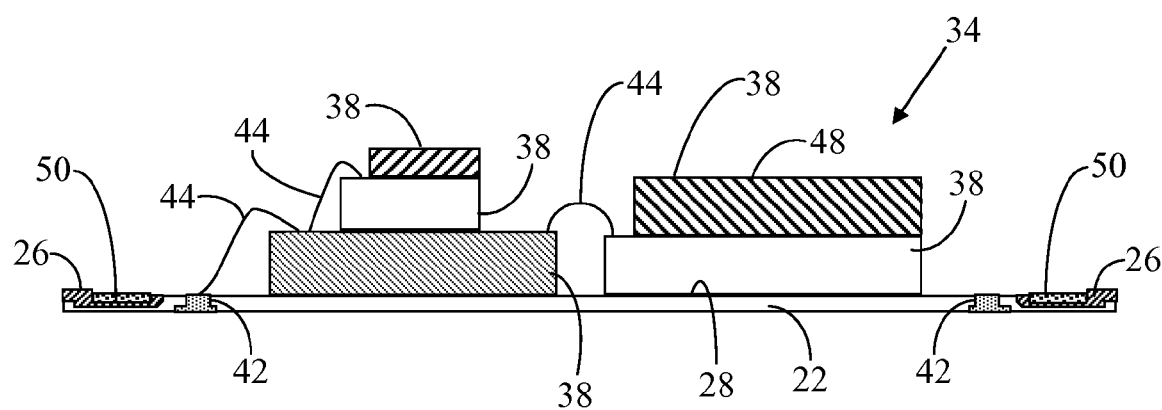
FIG. 4 shows a side view of the device along section lines 4-4 in FIG. 3.

Referring to FIGS. 3 and 4 in connection with activity 32, FIG. 3 shows a top view of a semiconductor device 34 at an initial stage 36 of packaging and FIG. 4 shows a side view of semiconductor device 34 along section lines 4-4 in FIG. 3. The following FIGS. 3-9 are illustrated using various shading and/or hatching to distinguish the different elements of semiconductors device 34 and semiconductor package 20 (FIG. 1), as will be discussed below. These different elements may be produced utilizing current and upcoming micromachining techniques.

Semiconductor device 34 includes base 22 and one or more semiconductor dies 38 coupled to base 22 and/or coupled to one another in a stacked formation. More specifically, base 22 may be a leadframe that includes a die pad 40 to which one or more semiconductor dies 38 are attached. Bond pads 42 may be arranged around die pad 40. Semiconductor dies 38 may be interconnected via one or more electrical interconnects, referred to herein as bonding wires 44, and/or semiconductor dies 38 may be connected to bond pads 42 arranged around die pad 40 via bonding wires 44. Some or all of bond pads 42 may be electrically coupled to leads 26. Alternatively, or additionally, some or all of bond pads 42 may be extend through base 22 to a lead contact region (not shown) on a lower surface of base 22.

The design configuration of at least one of semiconductor dies 38 calls for cavity packaging to provide suitable environmental protection. Furthermore, in an example, one of semiconductor dies 38 of semiconductor device 34 may be a MEMS device such as a gyroscope, accelerometer, sensor, or the like. This particular form of semiconductor die 38 will be referred to herein as a MEMS device 48. MEMS device 48 may be sealed in its own cavity package to protect its fragile moving parts. However, MEMS device 48, as well as the other semiconductor dies 38, electrical connections, and materials within cavity 25, may be damaged by the ingress of various fluids and/or particulates into cavity 25. Accordingly, a bonding perimeter 50 delineates, i.e., borders, an area 52 of die pad 40. Semiconductor dies 38, including MEMS device 48, are mounted to surface 28 of base 22 within area 52 delineated by bonding perimeter 50. Bonding perimeter 50 is the location at which a corresponding bonding perimeter of a lid, e.g., lid 24 (FIG. 1), is to be attached to base 22, as will be discussed in detail below.

Semiconductor device 34 with its attached semiconductor dies 38 and bonding wires 44 may be provided from a device manufacturer and packaged at a separate packaging facility. Alternatively, semiconductor device 34 may be fabricated and packaged within the same manufacturing facility.

With reference back to packaging process 30 (FIG. 2), following activity 32, an activity 54 is performed. At activity 54, a lid with a cavity formed therein is provided. For example, lid 24 (FIG. 1) having cavity 25 (FIG. 1) may be provided from a separate or the same manufacturing facility that is packaging semiconductor device 34.

Packaging process 20 continues with an activity 56. At activity 56, a heat curable adhesive material is applied to a portion of the bonding perimeter of either or both of base 22 or lid 24. Next, at an activity 58, lid 24 is placed on base 22.

Figure 5:
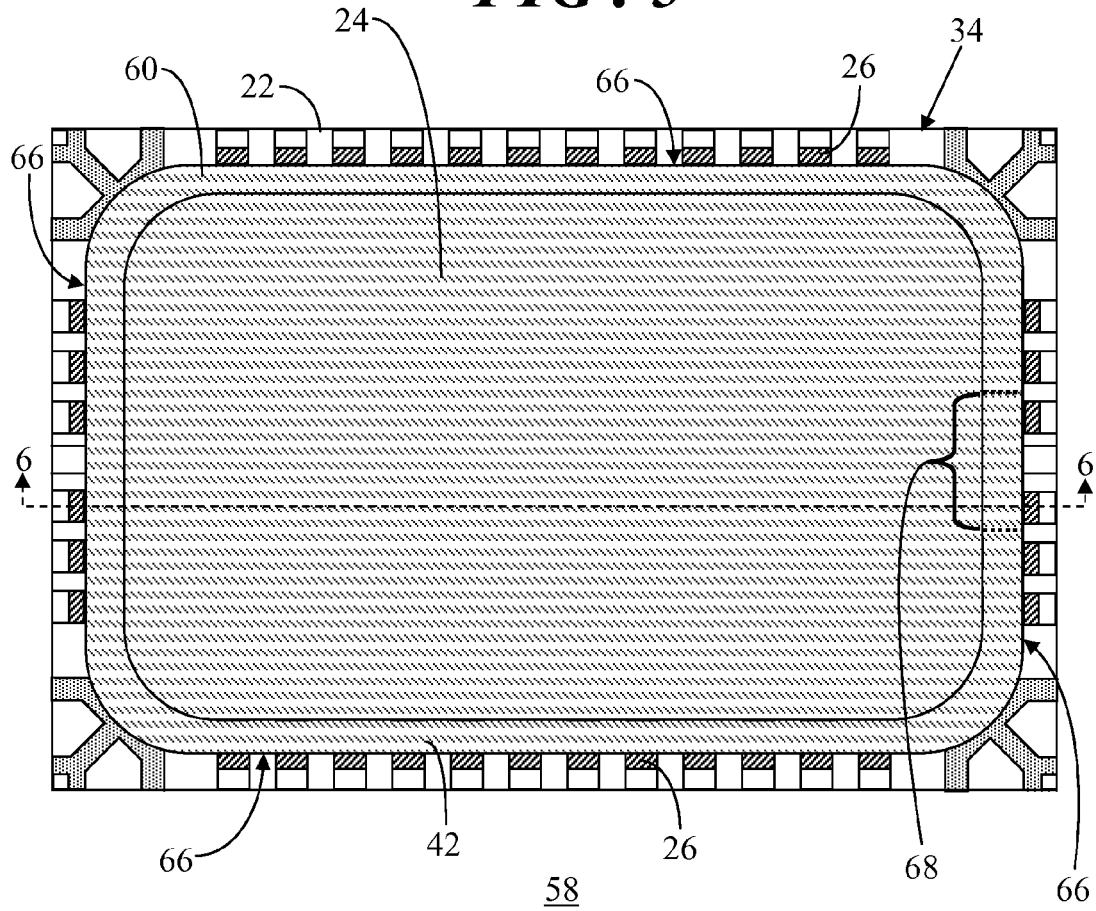
FIG. 5 shows a top view of the device at a subsequent stage of packaging.
Figure 6:
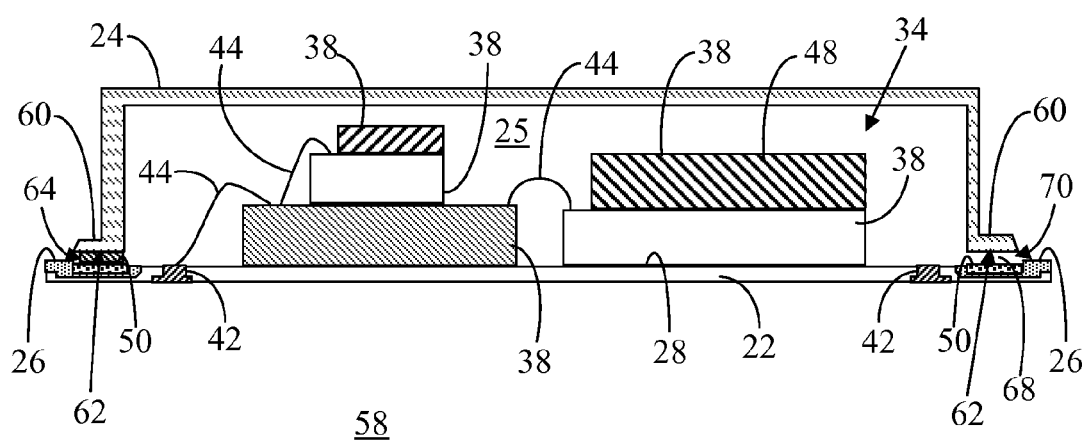
FIG. 6 shows a side view of the device along section lines 6-6 in FIG. 5.

Referring to FIGS. 5 and 6 in connection with activities 56 and 58 of packaging process 30, FIG. 5 shows a top view of semiconductor device 34 at a subsequent stage 58 of packaging and FIG. 6 shows a side view of semiconductor device 34 along section lines 6-6 in FIG. 5. As illustrated in FIGS. 5 and 6, lid 24 includes a flange 60. Flange 60 defines a bonding perimeter 62 for lid 24. More specifically, a bottom surface of flange 60 forms bonding perimeter 62 for lid 24. Bonding perimeter 62 of lid 24 is sized and shaped to abut bonding perimeter 50 on base 22.

In accordance with an embodiment, an adhesive material 64 is applied to a portion 66 of bonding perimeter 50 on base 22. However, adhesive material 64 is not applied to a remaining section 68 of bonding perimeter 50. As shown in FIG. 5, remaining section 68 underlies flange 60 of lid 24 and is demarcated by dotted lines. Thus, portion 66 of bonding perimeter 50 to which adhesive material 64 is applied constitutes the remainder of bonding perimeter 50, excluding section 68. In an embodiment, portion 66 to which adhesive material 64 is applied constitutes a majority of bonding perimeter 50, with section 68 being significantly smaller than portion 66. For example, portion 66 may be a generally "horseshoe shape" with only a small region along one side of bonding perimeter being reserved for section 68 that does not have adhesive material 64 applied to it.

In alternative embodiments, adhesive material 64 may be applied in a variety of patterns. One exemplary pattern includes spaced apart dots of adhesive material 64 applied to bonding perimeter 50. In such a configuration, remaining section 68 includes multiple sections (not shown) that do not have adhesive material 64 applied thereto, which are spaced apart around bonding perimeter 50 and are separated by portions 66 of bonding perimeter 50 to which adhesive material 64 is applied. Adhesive material 64 may alternatively be applied to a portion of bonding perimeter 62 of lid 24 in lieu of or in addition to bonding perimeter 50, with a remaining section, e.g., at section 68, of bonding perimeter 62 being without adhesive material 64. Thus, one or more sections 68 of both bonding perimeters 50 and 62 is without adhesive material 64.

Following application of adhesive material 64 to bonding perimeter 50 and/or to bonding perimeter 62, lid 24 is placed on base 22 so that bonding perimeter 62 of lid 24 abuts bonding perimeter 50. In the absence of adhesive material 64 at the one or more locations of section 68, one or more gaps 70 is formed between base 22 and lid 24. In the illustrated configuration a single gap 70 is especially evident in FIG. 6. Following task 58, semiconductor dies 38, including MEMS device 48, are located in cavity 25 of lid 24.

With reference back to FIG. 2, following activity 58 at which lid 24 is placed on base 22, packaging process 30 continues with an activity 72. At task 72, the structure of lid 24 and semiconductor device 34 is subjected to a heat curing process. When lid 24 is to function as a shield for semiconductor dies 38 located in cavity 25, an electrically conductive epoxy material is selected to be adhesive material 64. The electrically conductive adhesive material 64 provides a path to ground so that lid 24 effectively shields semiconductor dies 38. In a further embodiment, this electrically conductive epoxy material is also a heat curable material. A heat curable electrical conductive material is advantageous due at least in part to its relative ease of use, relatively long pot life, and high strength.

Heat curable epoxy material is typically cured, i.e., hardened, at temperatures at or above one hundred seventy degrees Celsius. As the structure is heated during the heat curing process, the air inside cavity 25 expands. Gap 70 (FIG. 6) between lid 24 and base 22 allows venting of this air from cavity 25 thereby largely preventing the formation of blow holes through adhesive material 64 applied between lid 24 and base 22.

Following heat curing activity 72, packaging process 30 continues with an activity 74. At activity 74, another adhesive material is applied to section 68 (FIG. 5) to close or otherwise seal gap 70 (FIG. 6). This second application of adhesive material may be performed utilizing standard dispense equipment in which a die bond dispense tip of a die bonder can draw a suitable line of adhesive materials at a particular location.

Next, an activity 76 is performed at which the adhesive material dispensed at activity 74 is suitably cured to yield semiconductors package 20 having a largely hermetically sealed bond between base 22 and lid 24. Following activity 76, packaging process 30 may include other activities that are not discussed herein for brevity. These additional fabrication activities can include forming external electrical interconnects, dicing, testing, and so forth. Process 40 ends following the packaging of semiconductor device 34 to produce semiconductor package 20.

Figure 7:
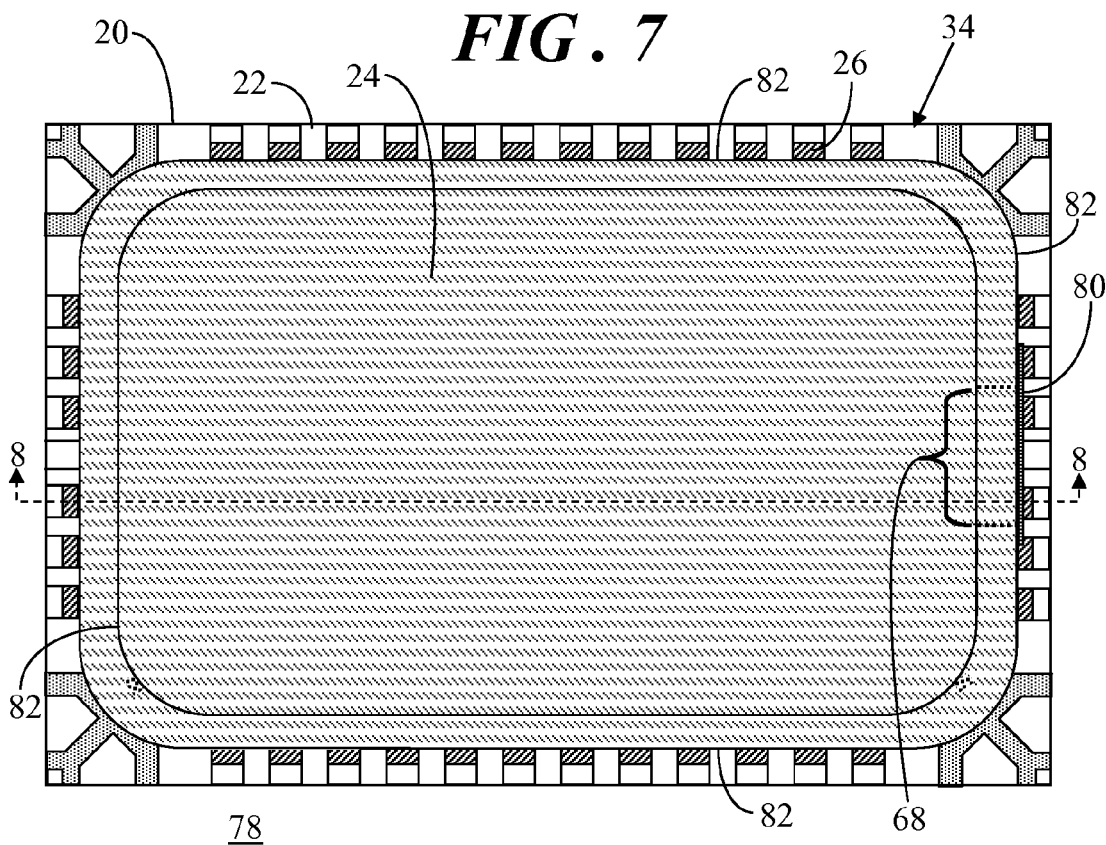
FIG. 7 shows a top view of the device at a subsequent stage of packaging.
Figure 8:
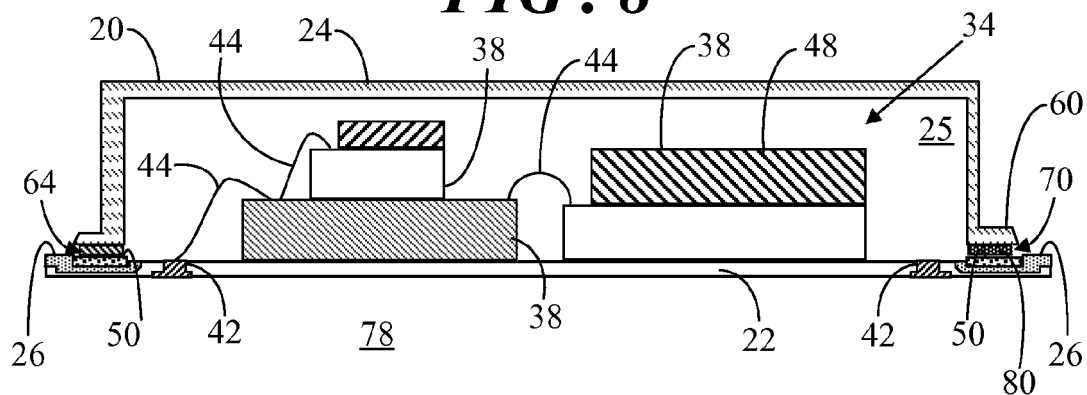
FIG. 8 shows a side view of the device along section lines 8-8 in FIG. 7.

Referring now to FIGS. 7 and 8, FIG. 7 shows a top view of semiconductor device 34 at a subsequent stage 78 of packaging, and FIG. 8 shows a side view of semiconductor device 34 along section lines 8-8 in FIG. 7. An adhesive material 80 is applied at the location of gap 70 in accordance with activity 74 (FIG. 2). Again, adhesive material 80 may be dispensed utilizing standard dispense equipment in which a die bond dispense tip of a die bonder applies a suitable line of adhesive material 80. As shown, adhesive material 80 may be dispensed so that it partially overlaps onto heat cured adhesive material 64, as represented by a bead or line of adhesive material 80 extending beyond the width of section 68 in FIG. 7. Of course, if multiple gaps 70 are formed, adhesive material 80 is applied at the locations of each of the multiple gaps 70 to close the multiple gaps 70.

Adhesive material 80 may be a product that cures at a significantly lower temperature than heat curable adhesive material 64. For example, adhesive material 80 may cure at a temperature of, for example, twenty to twenty-five degrees Celsius (sixty-eight to seventy-seven degrees Fahrenheit) which is commonly referred to as room temperature. Additionally, adhesive material 80 may be a light curable material that cures, for example, under ultraviolet (UV) radiation. Such a material is sometimes referred to as a UV curable material. UV curable materials cure, i.e., harden, almost instantly when exposed to UV radiation, eliminating the drying duration or heat-cure duration called for by other adhesive materials. Thus, at activity 76 (FIG. 2), adhesive material 80 may be exposed to UV radiation at room temperature per conventional techniques to facilitate the curing of adhesive material 80. Since a UV curable adhesive material 80 that cures at room temperature is implemented, the remaining air or gas in cavity 25 will undergo little to no expansion. Therefore, blow holes will not form through adhesive materials 64 and 80 when adhesive material 80 is cured. Accordingly, sealed cavity 25 is formed in which semiconductor dies 38, including MEMS device 48, are located.

Figure 9:
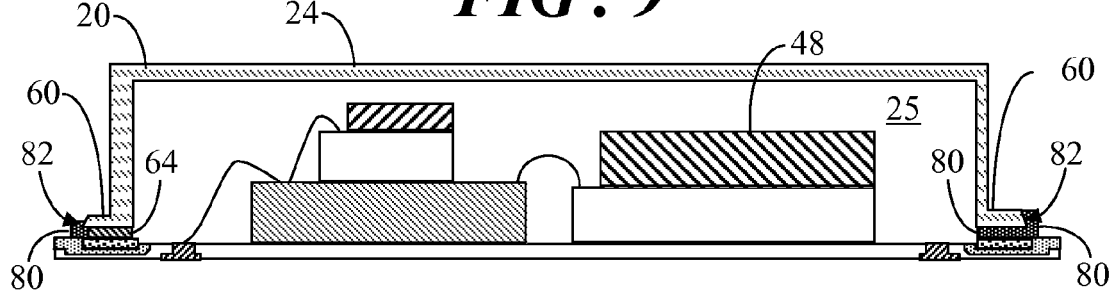
FIG. 9 shows a side view of the device in accordance with another embodiment.

FIG. 9 shows a side view of semiconductor package 20 in accordance with another embodiment. In some instances, it may be desirable to further ensure that no voids remain between base 22 and lid 24. Accordingly, at task 74 (FIG. 2) of packaging process 30 (FIG. 2), adhesive material 80 may be applied around an entire outer perimeter 82 (see also FIG. 7) of lid 24 at the junction between base 22 and lid 24. This application of adhesive material 80 may be performed concurrent with the application of adhesive material 80 to section 68 (FIG. 5) when closing gap 70 (FIG. 6).

Embodiments described herein entail a cavity-type semiconductor packaging methodology and a cavity-type semiconductor package structure packaged in accordance with the packaging methodology. The packaging methodology provides secure lid attachment that enables venting of the expanded gasses during heat curing, while yielding a hermetic or near-hermetic seal. In particular, the packaging methodology entails a two step adhesion process where a heat curable adhesive material is applied to a portion of a bonding perimeter between a base and lid so that one or more gaps remain that are without the heat curable adhesive material. During a heat curing process, an internal cavity of the lid can be suitably vented through these gaps. Following heat curing, the remainder of the bonding perimeter is bonded to close the one or more gaps using an adhesive material that cures at a significantly lower temperature, namely, room temperature. Thus, a sealed cavity-type package is formed in which semiconductor elements reside. The methodology is particularly suited to semiconductor packages that include a MEMS device that might otherwise be damaged using other lid attach techniques.

Although the preferred embodiments of the invention have been illustrated and described in detail, it will be readily apparent to those skilled in the art that various modifications may be made therein without departing from the spirit of the invention or from the scope of the appended claims. For example, the lid and base can take on various other shapes and sizes than those that are shown. Additionally, the semiconductor dies including the MEMS devices represent a variety of semiconductor devices for which cavity-type packaging is required.

What is claimed is:

1. A method of attaching a lid to a base to form a cavity-type semiconductor package, said lid being shaped to include a cavity, a semiconductor die being coupled to a surface of said base within an area delineated by a first bonding perimeter of said base, said lid having a second bonding perimeter, and said method comprising:

applying an electrically conductive epoxy adhesive material to a portion of at least one of said first and second bonding perimeters such that a remaining section of both of said first and second bonding perimeters is without said electrically conductive epoxy adhesive material;

placing said lid on said base so that said second bonding perimeter abuts said first bonding perimeter and a gap is produced between said base and said lid at a location where said remaining section is without said electrically conductive epoxy adhesive material;

heat curing said electrically conductive epoxy adhesive material, said heat curing occurring at a first temperature of at least one hundred seventy degrees Celsius, wherein during said heat curing operation, air inside said cavity expands in response to said first temperature and said gap allows venting of said air from said cavity; and following said heat curing, applying a second adhesive material to said remaining section to close said gap.

2. A method as claimed in claim 1 wherein said method further comprises curing said second adhesive material applied to said remaining section at a second temperature that is less than said first temperature.

3. A method as claimed in claim 2 wherein said second temperature is room temperature.

4. A method as claimed in claim 1 further comprising curing said second adhesive material applied to said remaining section by exposing said second adhesive material to ultraviolet radiation.

5. A method as claimed in claim 1 further comprising curing said second adhesive material applied to said remaining section to hermetically seal said cavity.

6. A method as claimed in claim 1 wherein said applying said second adhesive material occurs following said placing operation.

7. A method as claimed in claim 1 further comprising applying said second adhesive material around an entire outer perimeter of said lid at a junction between said base and said lid.

8. A method as claimed in claim 1 wherein:

said applying said first adhesive material includes producing multiple remaining sections of both of said first and second bonding perimeters that are without said first adhesive material so that multiple gaps are produced following said placing operation; and said applying said second adhesive material dispenses said second adhesive material to close each of said multiple gaps.

9. A method of attaching a lid to a base to form a cavity-type semiconductor package, said lid being shaped to include a cavity, a semiconductor die being coupled to a surface of said base within an area delineated by a first bonding perimeter of said base, said lid having a second bonding perimeter, and said method comprising:

applying a first adhesive material to a portion of at least one of said first and second bonding perimeters such that a remaining section of both of said first and second bonding perimeters is without said first adhesive material;

placing said lid on said base so that said second bonding perimeter abuts said first bonding perimeter and a gap is produced between said base and said lid at a location where said remaining section is without said first adhesive material;

heat curing said first adhesive material, said heat curing occurring at a first temperature of at least one hundred seventy degrees Celsius, wherein during said heat curing operation, air inside said cavity expands in response to said first temperature and said gap allows venting of said air from said cavity; and following said placing and heat curing operations, applying a second adhesive material to said remaining section to close said gap.

10. A method as claimed in claim 9 further comprising curing said second adhesive material applied to said remaining section to hermetically seal said cavity, said curing said second adhesive occurring at room temperature.

11. A method as claimed in claim 10 wherein said curing said second adhesive material includes exposing said second adhesive material to ultraviolet radiation.

* * * * *